US012727124B2

(12) United States Patent
Magcale et al.

(10) Patent No.: US 12,727,124 B2
(45) Date of Patent: Sep. 1, 2026

(54) DATA CENTER INFRASTRUCTURE MODULARIZATION SYSTEMS AND METHODS

(71) Applicant: Nautilus TRUE, LLC, San Ramon, CA (US)

(72) Inventors: Arnold Castillo Magcale, San Ramon, CA (US); Patrick J. Quirk, Huntsville, AL (US); Chase Abercrombie Ott, New York, NY (US); Robert C. Pfleging, O'Fallon, MO (US); Gabe Andrews, Colorado Springs, CO (US)

(73) Assignee: Nautilus TRUE, LLC, San Ramon, CA (US)

(*) Notice: Subject to any disclaimer, the term of this patent is extended or adjusted under 35 U.S.C. 154(b) by 0 days.

(21) Appl. No.: 17/531,707

(22) Filed: Nov. 19, 2021

(65) Prior Publication Data

US 2023/0189485 A1 Jun. 15, 2023

Related U.S. Application Data

(63) Continuation-in-part of application No. 17/494,827, filed on Oct. 5, 2021, now Pat. No. 11,690,203, and (Continued)

(51) Int. Cl.
*H05K 7/20* (2006.01)

(52) U.S. Cl.
CPC ..... *H05K 7/20818* (2013.01); *H05K 7/20309* (2013.01); *H05K 7/20327* (2013.01)

(58) Field of Classification Search
CPC ........... H05K 7/20818; H05K 7/20309; H05K 7/20327
See application file for complete search history.

(56) References Cited

U.S. PATENT DOCUMENTS 6,574,104 B2 * 6/2003 Patel .................. H05K 7/20745 62/263
7,961,463 B2 * 6/2011 Belady ............... H05K 7/20745 361/695

(Continued)

FOREIGN PATENT DOCUMENTS

WO WO-2013070104 A1 * 5/2013 ......... H05K 7/20745
WO WO-2023183264 9/2023

OTHER PUBLICATIONS

Co-pending U.S. Appl. No. 16/902,430, inventor Magcale; Arnold, filed Jun. 16, 2020.

(Continued)

*Primary Examiner* — Devon Lane
(74) *Attorney, Agent, or Firm* — Wilson Sonsini Goodrich & Rosati

(57) ABSTRACT

Embodiments disclosed include a data center comprising a first reconfigurable utility module comprising interfaces for facilitating electrical power supply, data connectivity, and cooling media supply, and further comprising a plurality of interfaces through which components may be connected to said first reconfigurable utility module. Additionally, a plurality of server modules are connected to the reconfigurable utility module through the interfaces, each of said server modules comprising one or more racks of servers, each of said server modules receiving said power supply, said data connectivity, and said cooling media through an interface through which it is connected to said reconfigurable utility module. Embodiments include one or more second reconfigurable utility modules, each of the one or more second reconfigurable utility modules being connected to the data center by: (a) being attached to one of said server modules; or (b) being attached to another one of the second reconfigurable utility modules; or (c) being attached to said first reconfigurable utility module, a first one of said second (Continued)

reconfigurable modules being extensible to accommodate an additional number of modules, and being reducible to accommodate fewer modules.

11 Claims, 14 Drawing Sheets

Related U.S. Application Data a continuation-in-part of application No. 17/460,672, filed on Aug. 30, 2021, now Pat. No. 11,683,915, which is a continuation of application No. 17/221,797, filed on Apr. 3, 2021, and a continuation-in-part of application No. 16/052,273, filed on Aug. 1, 2018, now Pat. No. 11,224,145.

(56) References Cited

U.S. PATENT DOCUMENTS 7,990,710 B2 * 8/2011 Hellriegel ................. G05F 1/66 165/80.4
8,077,457 B2 * 12/2011 Gauthier ................. H02J 9/061 361/701
8,180,495 B1 * 5/2012 Roy ................... H05K 7/20836 700/278
8,988,879 B2 * 3/2015 Hamburgen ......... H05K 7/2079 361/679.48
9,439,322 B1 9/2016 Magcale et al.
9,784,460 B2 10/2017 Magcale et al.
9,814,163 B2 11/2017 Magcale et al.
10,111,361 B2 10/2018 Magcale et al.
10,178,810 B1 1/2019 Magcale et al.
10,437,636 B2 10/2019 Magcale et al.
10,470,342 B2 11/2019 Magcale et al.
10,673,684 B2 6/2020 Magcale
10,852,805 B2 12/2020 Magcale et al.
10,920,414 B2 * 2/2021 Gordon ............... E04B 1/34321
11,102,915 B1 8/2021 Magcale
11,182,201 B1 11/2021 Magcale
11,224,145 B2 1/2022 Magcale et al.
11,246,243 B2 2/2022 Magcale et al.
11,297,742 B2 4/2022 Magcale et al.
11,683,915 B1 6/2023 Magcale
11,704,189 B1 7/2023 Magcale
11,765,869 B1 9/2023 Magcale
11,775,826 B2 10/2023 Magcale
11,882,677 B1 1/2024 Castillo Magcale et al.
11,946,269 B2 4/2024 Andrews et al.
2007/0274035 A1 * 11/2007 Fink ......................... H05K 7/20 361/679.46
2009/0050591 A1 2/2009 Hart et al.
2009/0229194 A1 * 9/2009 Armillas .............. H05K 7/1497 211/162
2010/0110626 A1 5/2010 Schmitt et al.
2010/0114356 A1 5/2010 Schmitt et al.
2010/0170277 A1 7/2010 Schmitt et al.
2011/0083824 A1 4/2011 Rogers
2011/0138708 A1 * 6/2011 Chazelle ................... E04H 1/06 52/302.1
2011/0220324 A1 * 9/2011 Lindenstruth ............. E04H 5/02 165/104.19
2012/0134107 A1 5/2012 Peng et al.
2012/0152777 A1 6/2012 Lin
2012/0255710 A1 10/2012 Maselli et al.
2014/0157692 A1 6/2014 Parizeau et al.
2014/0213169 A1 * 7/2014 Rasmussen .......... H05K 7/1497 220/23.83
2014/0331582 A1 11/2014 Klaba
2014/0343745 A1 * 11/2014 Slessman ............. B65D 65/466 700/297
2015/0098177 A1 4/2015 Wilcox et al.
2015/0240474 A1 8/2015 Kokoschka et al.
2015/0305203 A1 10/2015 Chang et al.
2016/0057894 A1 2/2016 Chen
2016/0194863 A1 7/2016 Schmitt et al.
2016/0249484 A1 8/2016 Parizeau et al.
2018/0109163 A1 4/2018 Paine et al.
2018/0376624 A1 12/2018 Magcale et al.
2019/0343025 A1 11/2019 Magcale et al.
2020/0348034 A1 11/2020 Magcale
2021/0081022 A1 3/2021 Magcale
2022/0075648 A1 3/2022 Magcale
2022/0106784 A1 4/2022 Igarashi et al.
2022/0145611 A1 5/2022 Kuehmstedt
2022/0188634 A1 6/2022 Magcale
2023/0078304 A1 * 3/2023 Liu .................... H05K 7/20327 361/700
2024/0254788 A1 8/2024 Andrews et al.
2025/0386460 A1 * 12/2025 Cole .................. H05K 7/20745

OTHER PUBLICATIONS

Co-pending U.S. Appl. No. 17/381,182, inventor Magcale; Arnold, filed Jul. 20, 2021.
Co-pending U.S. Appl. No. 17/460,672, inventor Magcale; Arnold, filed Aug. 30, 2021.
Co-pending U.S. Appl. No. 17/588,363, inventors Magcale; Arnold et al., filed Jan. 31, 2022.
Co-pending U.S. Appl. No. 18/052,867, inventors Andrews; Gabe et al., filed Nov. 4, 2022.
PCT/US2023/015698 International Search Report and Written Opinion dated Apr. 17, 2023.
U.S. Appl. No. 18/052,867 Office Action dated Feb. 14, 2023.
U.S. Appl. No. 18/052,867 Notice of Allowance dated Nov. 15, 2023.
U.S. Appl. No. 18/052,867 Office Action dated Jun. 20, 2023.

* cited by examiner

DATA CENTER INFRASTRUCTURE MODULARIZATION SYSTEMS AND METHODS

CROSS REFERENCE TO RELATED APPLICATIONS

This application is a continuation-in-part of application Ser. No. 17/494,827, filed Oct. 5, 2021, now U.S. Pat. No. 11,690,203, issued Jun. 27, 2023; a continuation-in-part of application Ser. No. 17/460,672, filed Aug. 30, 2021, now U.S. Pat. No. 11,683,915, issued Jun. 20, 2023. which is a continuation of application Ser. No. 17/221,797, filed Apr. 3, 2021, now U.S. Pat. No. 12,063,761, issued Aug. 13, 2024; and a continuation-in-part of application Ser. No. 16/052,273, now U.S. Pat. No. 11,224,145, issued Jan. 11, 2022; each of which is incorporated herein by reference in their entirety.

TECHNICAL FIELD

The present application relates to modularity and modular infrastructure slabs (MIS) in data center systems and methods.

BACKGROUND OF THE INVENTION

A data center is a facility designed to house, maintain, and power a plurality of computer systems. A conventional data center is constructed entirely on-site with installation of all electrical, mechanical and cooling equipment performed on site after construction of the data center facility is completed. Design and deployment of a conventional data center requires extensive time in planning and construction. Data center deployment cycles can take two years from start to fully operational.

Traditional data center deployment methods require extensive time for planning and construction. All electrical, mechanical and cooling systems are fabricated and constructed on site after the construction of the data center facility building has been completed. After the data center construction has been completed, installing racks to house the computer systems is another time-consuming effort that may take additional weeks to complete.

The described methods and systems include use of prefabricated data center modules, which when employed, drastically reduce the build deployment time of a data center facility from start to fully operational.

SUMMARY

Embodiments disclosed include a data center comprising a first reconfigurable utility module comprising means for facilitating electrical power supply, data connectivity, and cooling media supply, and further comprising a plurality of interfaces through which components may be connected to said first reconfigurable utility module. According to an embodiment, a plurality of server modules are connected to the reconfigurable utility module through the interfaces, each of said server modules comprising one or more racks of servers, each of said server modules receiving said power supply, said data connectivity, and said cooling media through an interface through which it is connected to said reconfigurable utility module. Preferably, an embodiment includes one or more second reconfigurable utility modules, each of the one or more second reconfigurable utility modules being connected to the data center by: (a) being attached to one of said server modules; or (b) being attached to another one of the second reconfigurable utility modules; or (c) being attached to said first reconfigurable utility module, a first one of said second reconfigurable modules being extensible to accommodate an additional number of modules, and being reducible to accommodate fewer modules.

An embodiment includes a data center comprising a first reconfigurable utility module comprising means for facilitating electrical power supply, data connectivity, and cooling media, and further comprising a plurality of interfaces through which components are connectable to said first reconfigurable utility module. Preferably, an embodiment includes a plurality of server modules that are connected to the first reconfigurable utility module through the interfaces, each of said server modules comprising one or more racks of servers, each of said server modules receiving said power, said data connectivity, and said cooling media through an interface through which it is connected to said first reconfigurable utility module. An embodiment includes one or more second reconfigurable utility modules, each of the second reconfigurable utility modules implementing a function that provides a capability to the data center, each of said one or more second reconfigurable utility modules comprising one or more spine modules, said utility spine being composed of one or more spine modules, said utility spine being extensible to accommodate an additional number of modules by addition of a spine module, and being reducible to accommodate fewer modules by removal of a spine module. Preferably an embodiment also comprises a cooling module.

An embodiment includes a data center comprising a first reconfigurable utility module comprising means for facilitating electrical power supply, data connectivity, and cooling media, and further comprising a plurality of interfaces through which components are connectable to said first reconfigurable utility module, said first reconfigurable utility module being composed of one or more spine modules, said utility spine being extensible to accommodate an additional number of modules by addition of a spine module, and being reducible to accommodate fewer modules by removal of a spine module, said utility spine being connected to one or more server modules that contain servers and that receive power, data connectivity, and cooling media through an interface through which each of the server modules is connected to said first reconfigurable utility module.

BRIEF DESCRIPTION OF THE DRAWINGS

The present invention can be better understood with reference to the following figures. In the figures, like reference numerals designate corresponding parts throughout the different views and/or embodiments. It will be understood that certain components and details may not appear in the figures to assist in more clearly describing the invention.

DETAILED DESCRIPTION

The following is a detailed description of embodiments of the invention depicted in the accompanying drawings. The embodiments are introduced in such detail as to clearly communicate the invention. However, the embodiment(s) presented herein are merely illustrative and are not intended to limit the anticipated variations of such embodiments; on the contrary, the intention is to cover all modifications, equivalents, and alternatives falling within the spirit and scope of the appended claims. The detailed descriptions below are designed to make such embodiments obvious to those of ordinary skill in the art.

Figure 1:
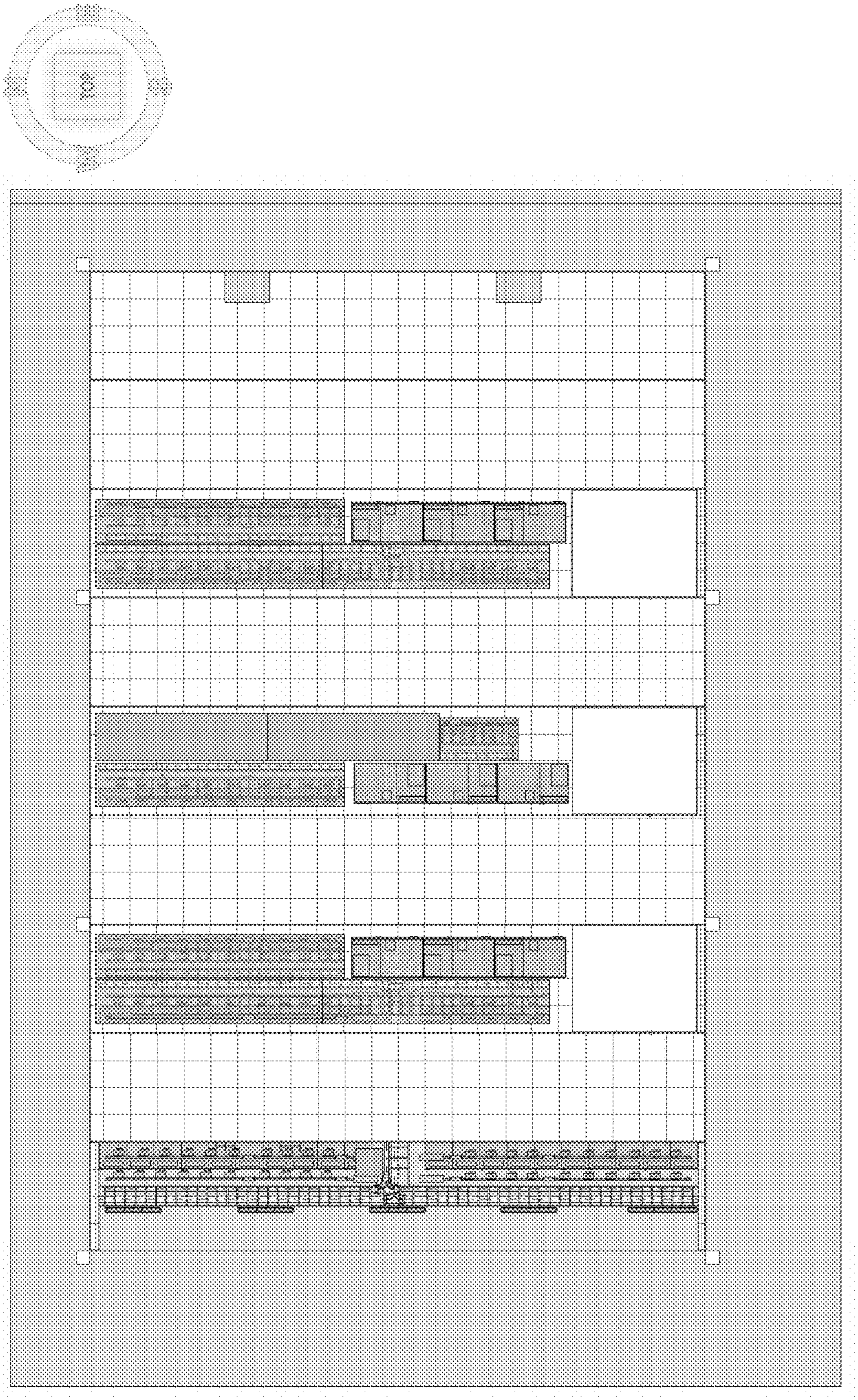
FIG. 1 illustrates a 2-Dimensional aspect of the invention according to one embodiment.

The industrialization of data center construction has enabled the industry to dramatically reduce build times and cost per megawatt. Embodiments disclosed include Modular Infrastructure Slabs (MIS) to enable modularization by creating a combined MEP, Structural, and Data Hall Ceiling element that can be factory built, tested, shipped and placed onto a defined support structure to rapidly assemble and commission a land or vessel-based data center. FIG. 1 illustrates a 2-Dimensional aspect of the invention according to one embodiment.

According to an embodiment of a data center, the data center comprises a first reconfigurable utility module comprising means for facilitating electrical power supply, data connectivity, and cooling media supply, and further comprising a plurality of interfaces through which components may be connected to said first reconfigurable utility module. A plurality of server modules comprised in the first reconfigurable utility module in a data hall enclosed by a data hall ceiling element are connected to the interfaces, each of said server modules comprising one or more racks of servers, each of said server modules receiving said power supply, said data connectivity, and said cooling media through an interface through which it is connected to said reconfigurable utility module. According to an embodiment, one or more second reconfigurable utility modules are operatively connected to the data center by: (a) a modular attachment to one of said server modules; or (b) an attachment to another one of the second reconfigurable utility modules; or (c) a modular attachment to said first reconfigurable utility module, a first one of said second reconfigurable modules being extensible to accommodate an additional number of modules, and being reducible to accommodate fewer modules. According to a preferred embodiment the second reconfigurable module is positioned above the data hall on a second storey and comprises a plurality of expandable and contractable rails to accommodate cooling and electrical supply modules.

According to an embodiment, a first one of said second reconfigurable modules implements a cooling function, said first one of said second reconfigurable modules being operatively coupled to one of said server modules. Preferably, the cooling function is implemented through roof mounted closed loop modular cooling systems operatively coupled to open loop modular cooling systems that draw water from natural environmental sources in an open loop cooling system. The closed loop cooling systems use water or any suitable environmentally friendly coolant. Alternatively, complete closed loop cooling systems may be implemented in areas of water scarcity. Variations and modifications are possible as would apparent to a person having ordinary skill in the art.

According to an alternate embodiment, a first one of said second reconfigurable modules implements a fire protection function.

According to an embodiment, a first one of said second reconfigurable modules comprises an alternate power source or backup power generator, wherein the backup power generator is operatively attached to said data center through the interface of said first reconfigurable utility module.

According to an embodiment, a first one of said second reconfigurable modules comprises an uninterruptable power supply. Preferable, the UPS is modular, reconfigurable, roof mounted uninterruptable power supply.

According to a preferred embodiment, the server modules and said second reconfigurable utility modules are prefabricated away from a site at which said data center is located, wherein said server modules comprise shipping containers in which said one or more racks of servers are installed. A preferred embodiment includes modular infrastructure slabs (MIS) in addition or/and as an alternative to shipping containers.

According to a preferred embodiment, a specification defines functional capabilities of a data center that meets a reliability level, and wherein said first and second reconfigurable utility modules are calibrated to enable said data center to satisfy said specification.

According to an embodiment, a data center comprises a first reconfigurable utility module comprising an interface for facilitating electrical power supply, data connectivity, and cooling media, and further comprising a plurality of interfaces through which components are connectable to said first reconfigurable utility module. Preferably, a plurality of server modules are comprised in the first reconfigurable utility module and connected to each other through the interfaces, each of said server modules comprising one or more racks of servers, each of said server modules receiving said power, said data connectivity, and said cooling media through a respective interface through which it is connected to said first reconfigurable utility module. Preferably, the embodiment includes one or more second reconfigurable utility modules, each of the second reconfigurable utility modules implementing a function that provides a capability to the data center, each of said one or more second reconfigurable utility modules comprising one or more interfaces, the one or more interfaces being extensible to accommodate an additional number of modules, and being reducible to accommodate fewer modules by removal of an interface; and a cooling module.

According to an alternate embodiment, the one or more second reconfigurable utility modules comprise a plurality of expandable and contractable rails to accommodate cooling and electrical supply modules.

According to an embodiment, a first one of said second one or more reconfigurable utility modules comprises a backup power source or/and a backup generator, wherein the back-up power source or/and generator is operatively attached to the data center through the plurality of interfaces. In a preferred embodiment, a first one of the second reconfigurable utility modules comprises a modular expandable and contractable uninterruptable power supply.

According to an embodiment, the server modules and second reconfigurable utility modules are pre-fabricated away from a site at which the data center is located.

According to an embodiment, a data center comprises a first reconfigurable utility module comprising a plurality of interfaces for facilitating electrical power supply, data connectivity, and cooling media, and through which modular components are connectable to said first reconfigurable utility module, wherein the interfaces are preferably extensible to accommodate an additional number of modules, and contractable/reducible to accommodate fewer modules by removal of an interface, said plurality of interfaces being connected to one or more server modules that contain servers and that receive power, data connectivity, and cooling media through the respective interfaces through which each of the server modules is connected to said first reconfigurable utility module.

According to an embodiment, the one or more second reconfigurable utility modules comprise a plurality of expandable and contractable rails to accommodate cooling and electrical supply modules.

An embodiment includes one or more second reconfigurable utility modules, wherein a first one of said second reconfigurable utility modules comprises a backup power source or/and a backup generator, wherein the backup power source or/and generator is operatively attached to the data center through the respective interfaces.

According to a preferred embodiment, the server modules and function modules are pre-fabricated away from a site at which the data center is located.

Figure 2:
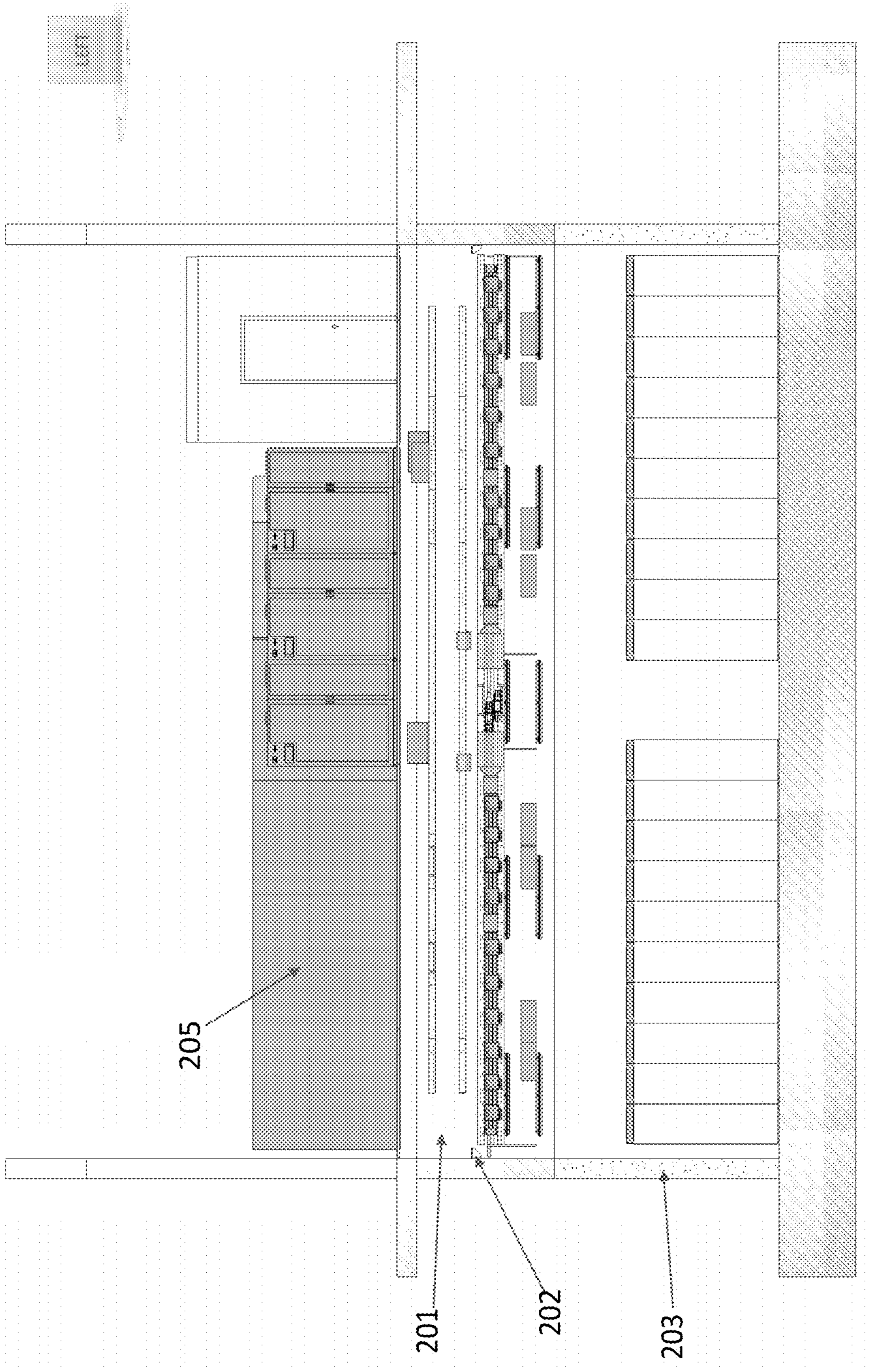
FIG. 2 illustrates sectional perspectives of a modular data center according to an embodiment.

FIG. 2 illustrates sectional perspectives of a modular data center according to an embodiment. According to the illustrated embodiment of the invention, 2500 kVA Building Blocks are shown, Concurrently Maintainable, and in a preferred embodiment, the Design is based on 5:4 Electrical Reserve—up to four 2.5 MW data halls per reserve lineup. The illustrated embodiment comprises steel truss frames 201 to accommodate roof top MIS modules and cooling modules. Additionally, the embodiment comprises steel tube support 202 for the modules which comprise electrical and cooling equipment 205, wherein the cooling equipment is coupled to roof mounted cooling modules. The illustrated embodiment further includes a data hall to accommodate a plurality of data racks 203. According to an embodiment, the cooling systems are adaptable to pumped or gravity fed Open Loop naturally cool water. A preferred embodiment includes a hybrid cooling system capable of both pumped and gravity induced open loop cooling from a natural water source. According to an embodiment, a single or plurality of Data Halls are equipped with N+1 Cooling capacity. Preferably, 2×10 Cabinet contained hot aisles and 2N (A/B) power distribution wherein the data halls comprise Floor space reserved for IT cabinets. In one embodiment, 4' Aisles make for ease of access and are configured to contain up to 58U cabinets.

Figure 3:
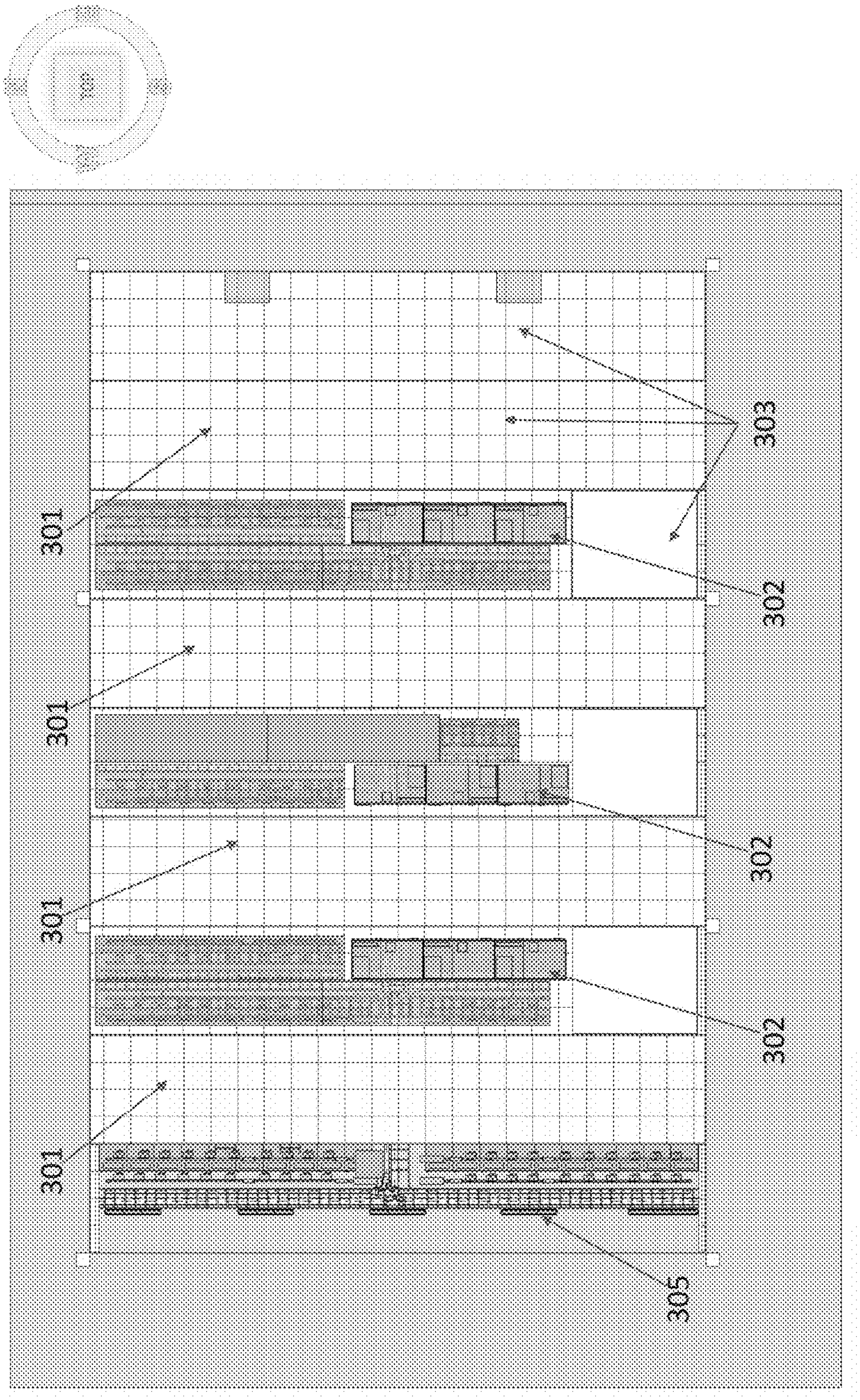
FIG. 3 is a top view of the embodiment illustrated in FIG. 2 i.e., the MEP space.
Figure 4:
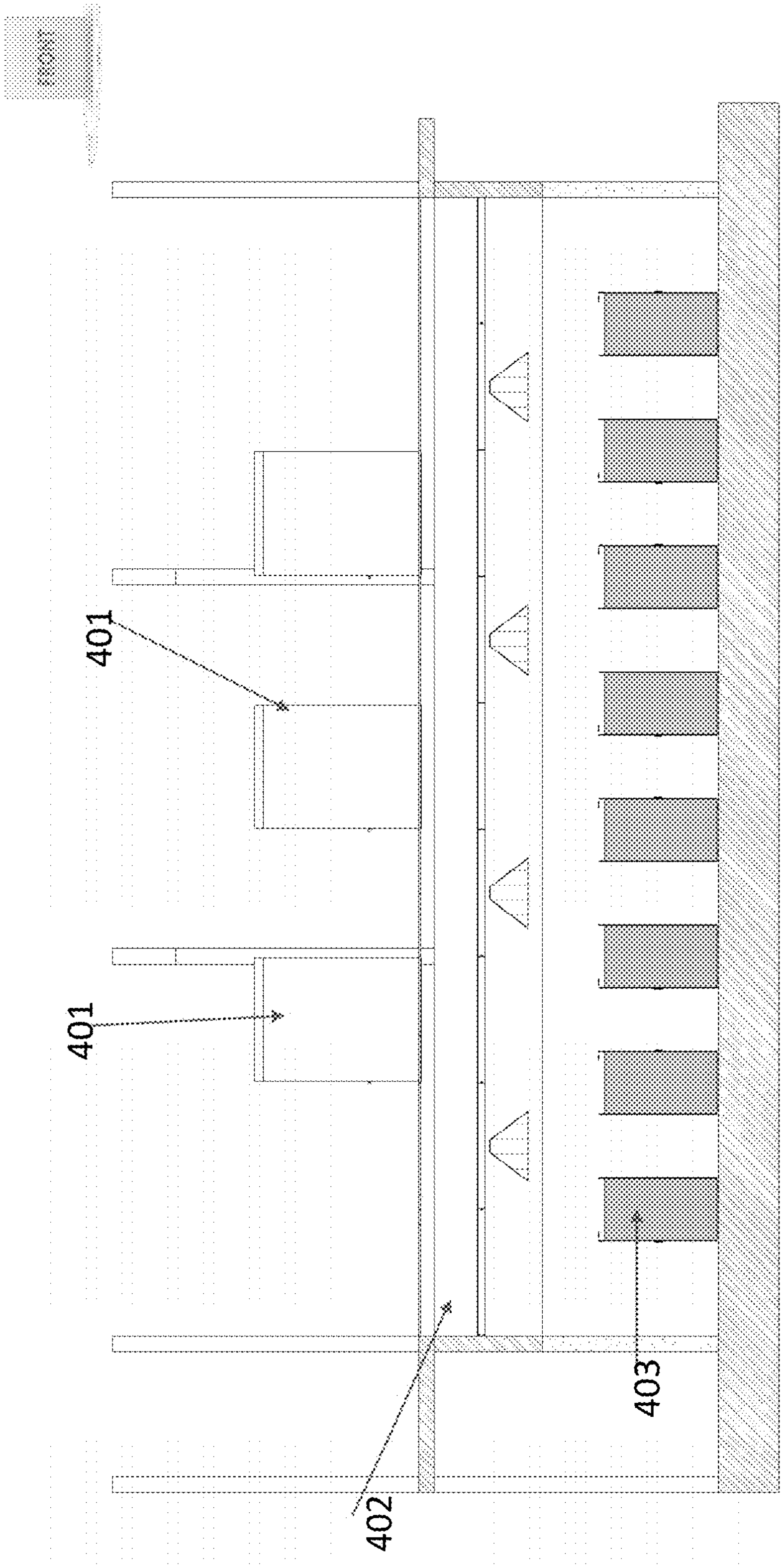
FIG. 4 is a cross sectional view of the MEP, structural floor, ceiling and data hall.
Figure 5A:
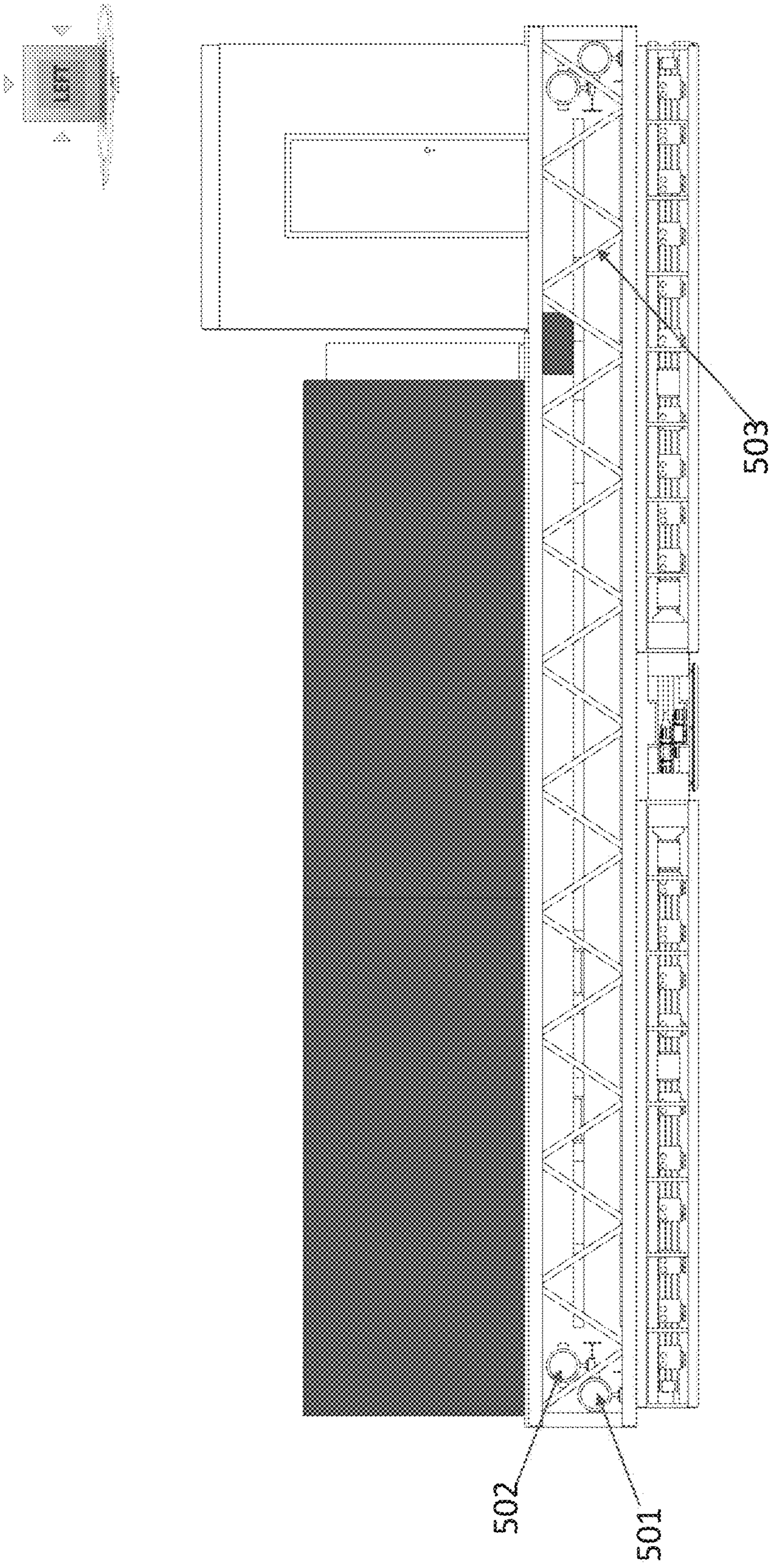
FIGS. 5A and 5B illustrate views of the primary electrical module in the MIS (Modular Infrastructure Slab).
Figure 5B:
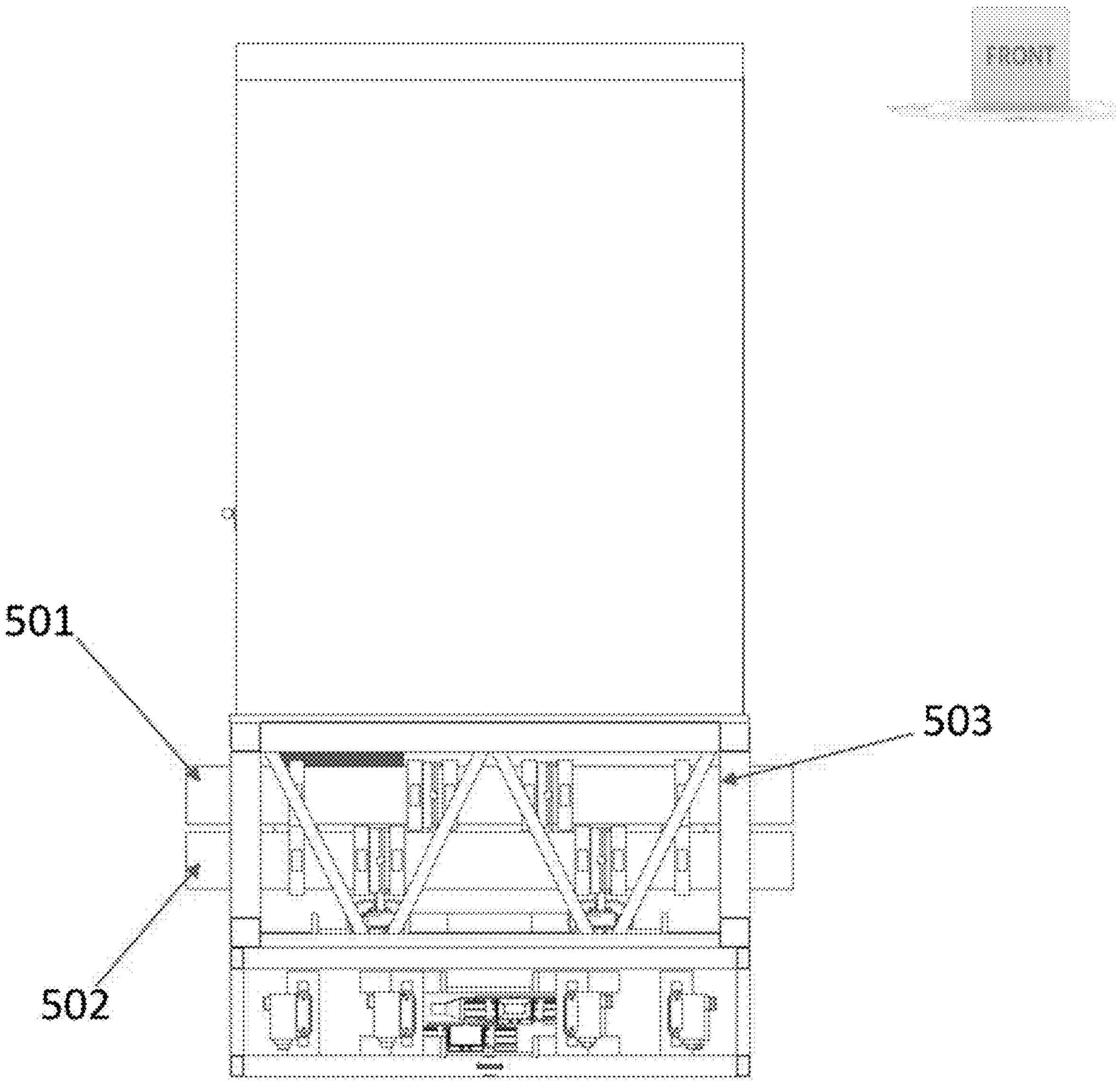
Figure 6A:
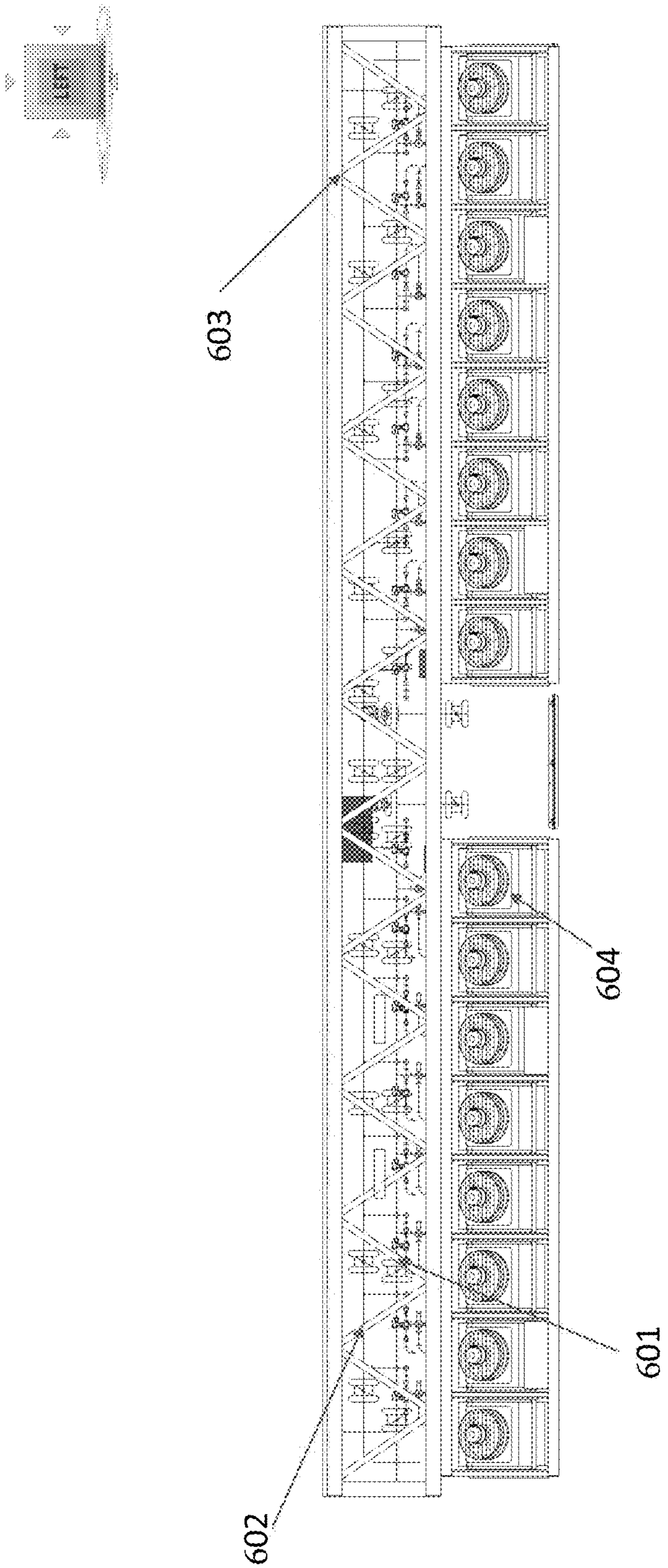
FIG. 6A illustrates a cross sectional view of Aisle/Cooling MIS according to an embodiment.
Figure 6B:
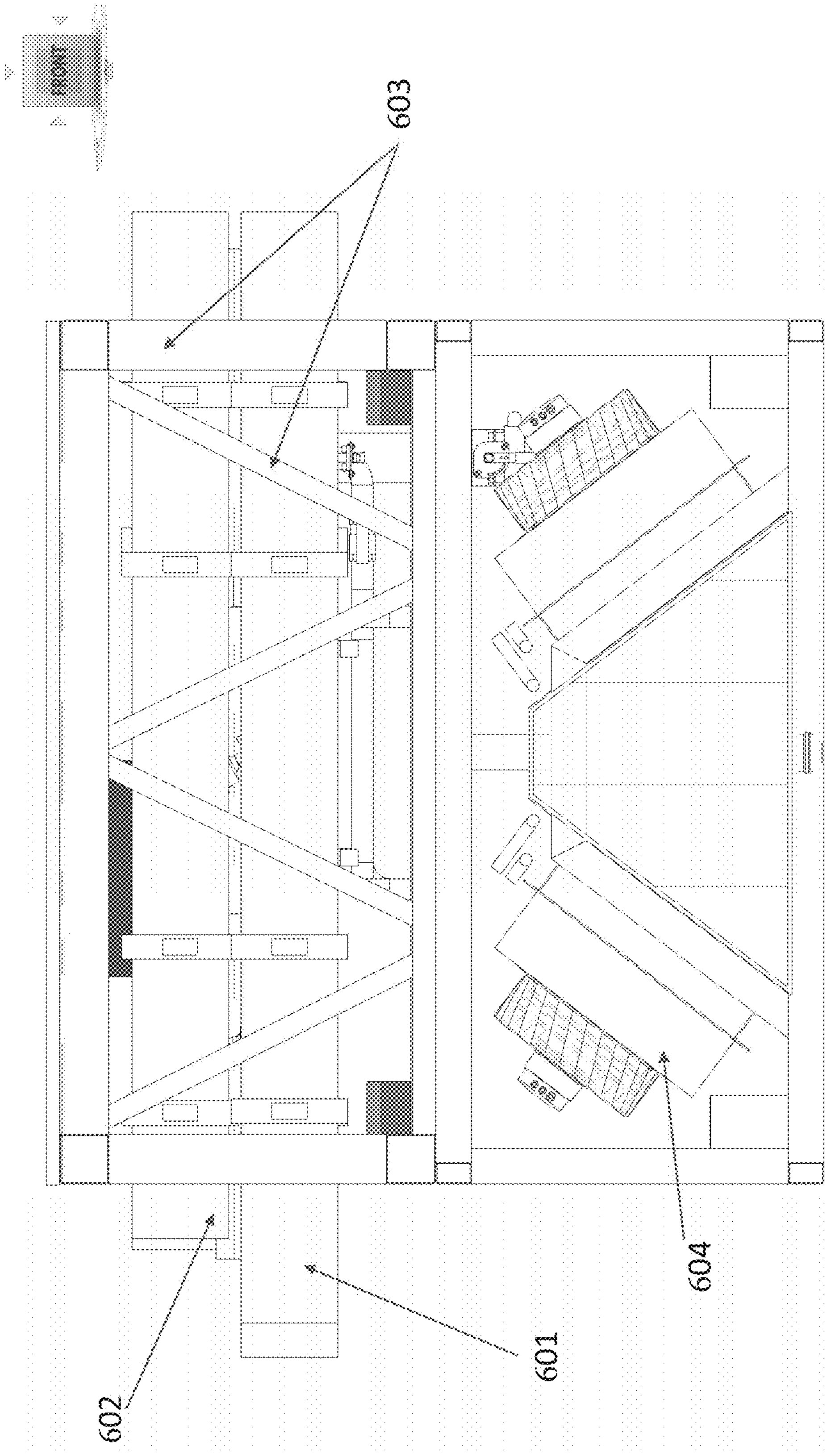
FIG. 6B illustrates a cross sectional end view of Aisle/Cooling MIS according to an embodiment.
Figure 7A:
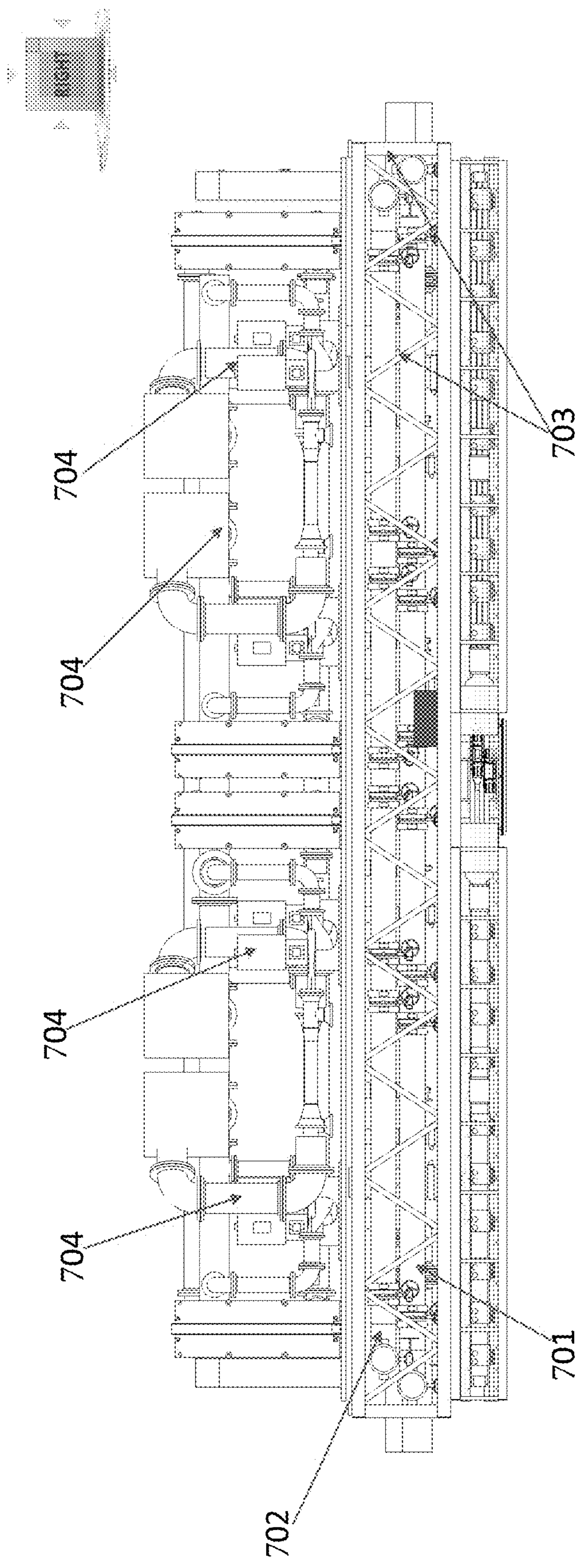
FIG. 7A illustrates a cross sectional view of CDU MIS according to an embodiment.
Figure 7B:
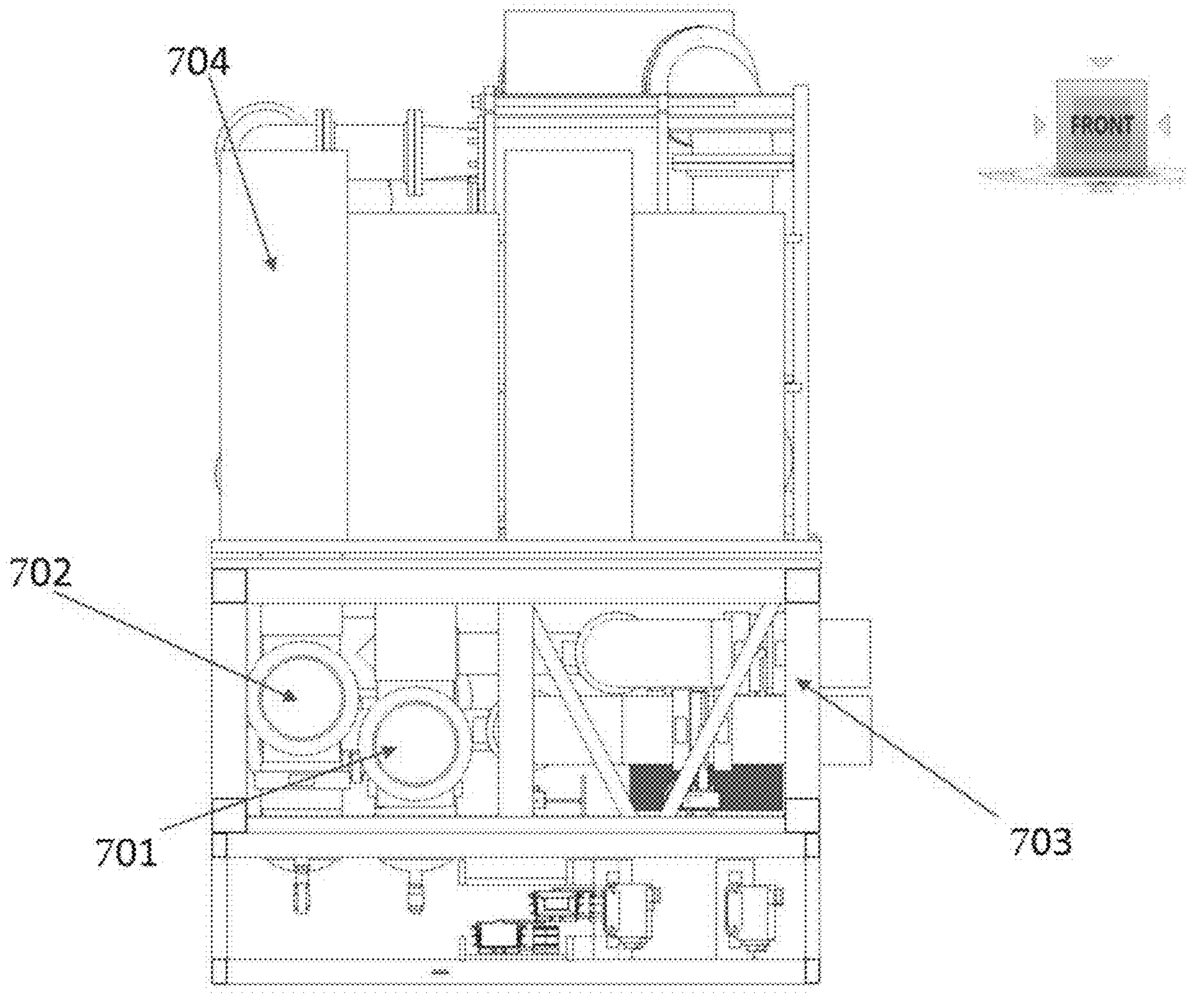
FIG. 7B illustrates a cross sectional end view of CDU MIS according to an embodiment.
Figure 8A:
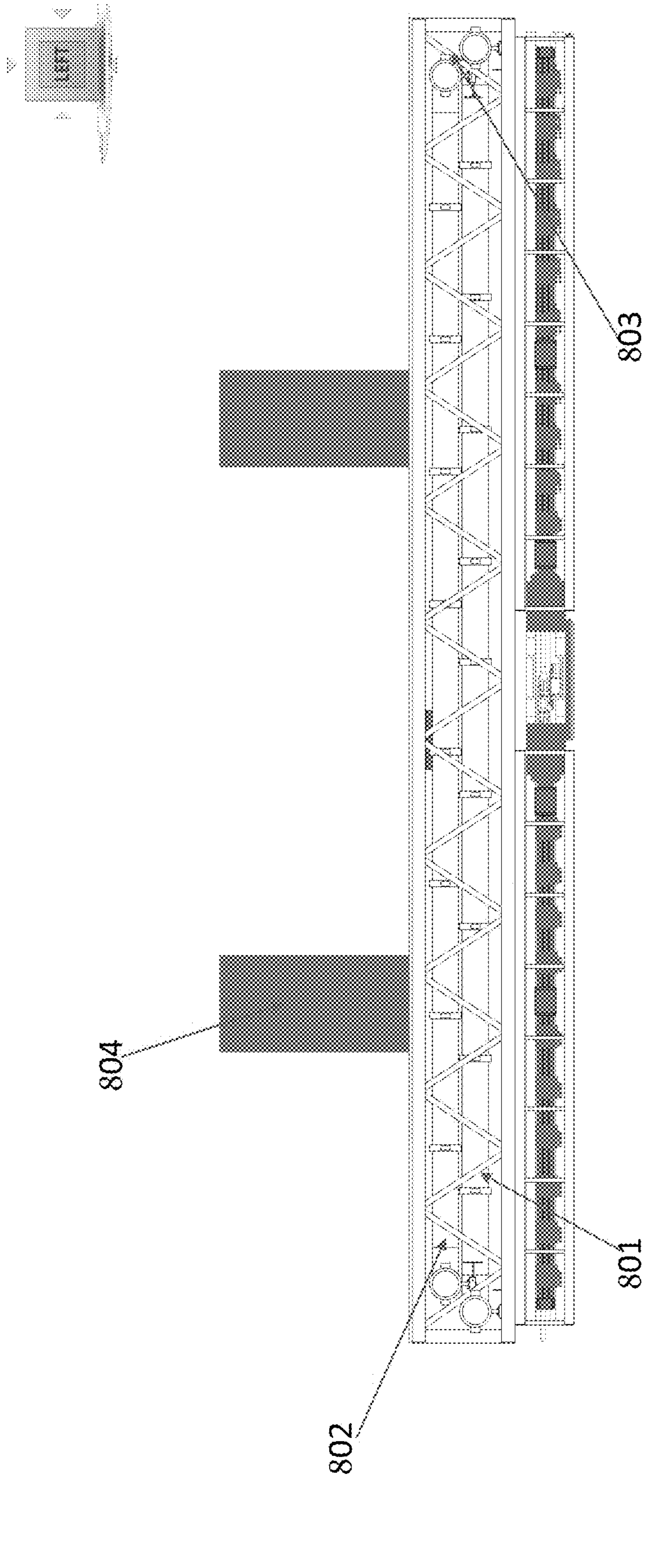
FIG. 8A illustrates a cross sectional view of accessory MIS according to an embodiment.
Figure 8B:
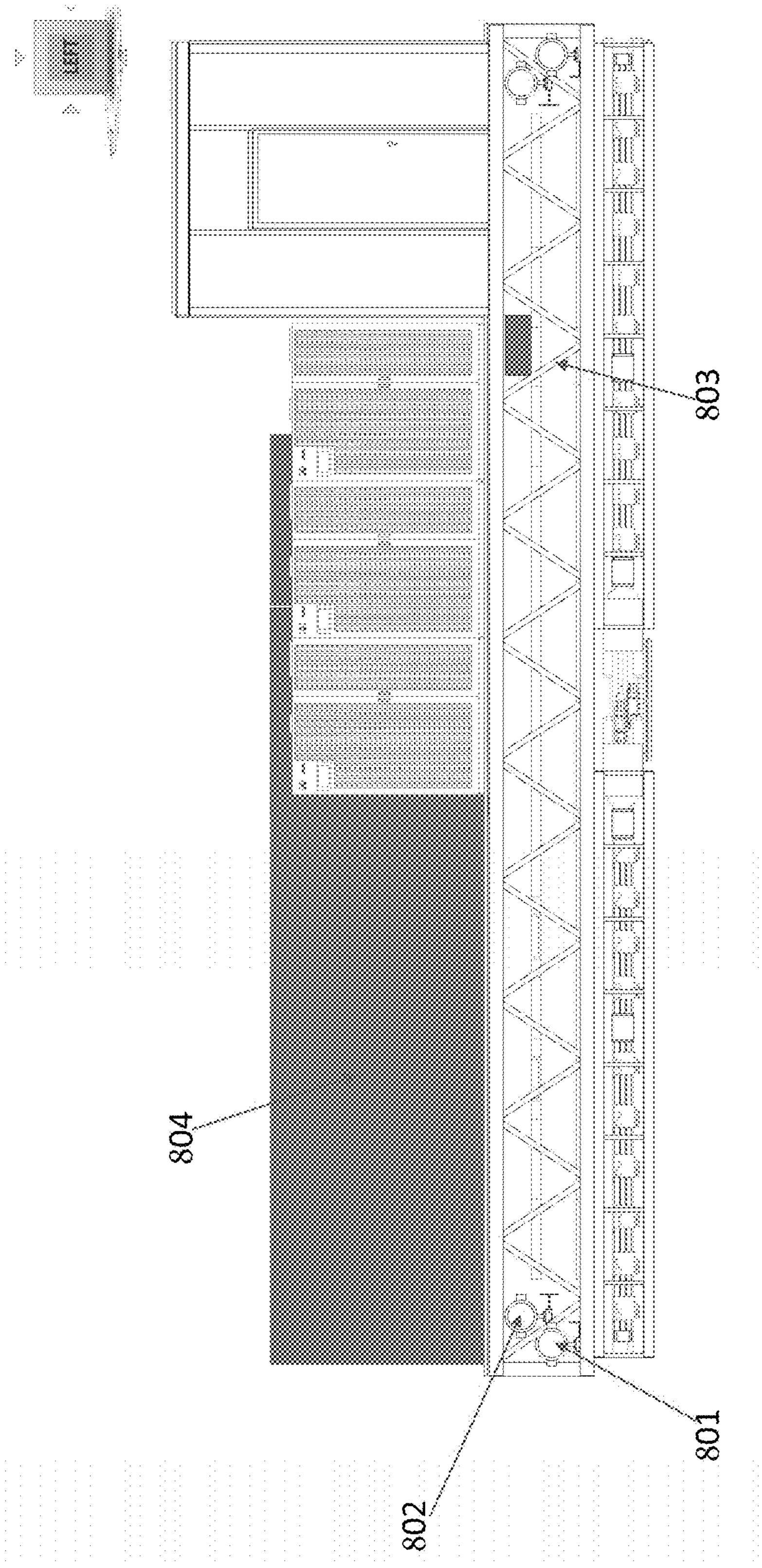
FIG. 8B illustrates a cross sectional end view of reserve power systems module MIS according to an embodiment.
Figure 9:
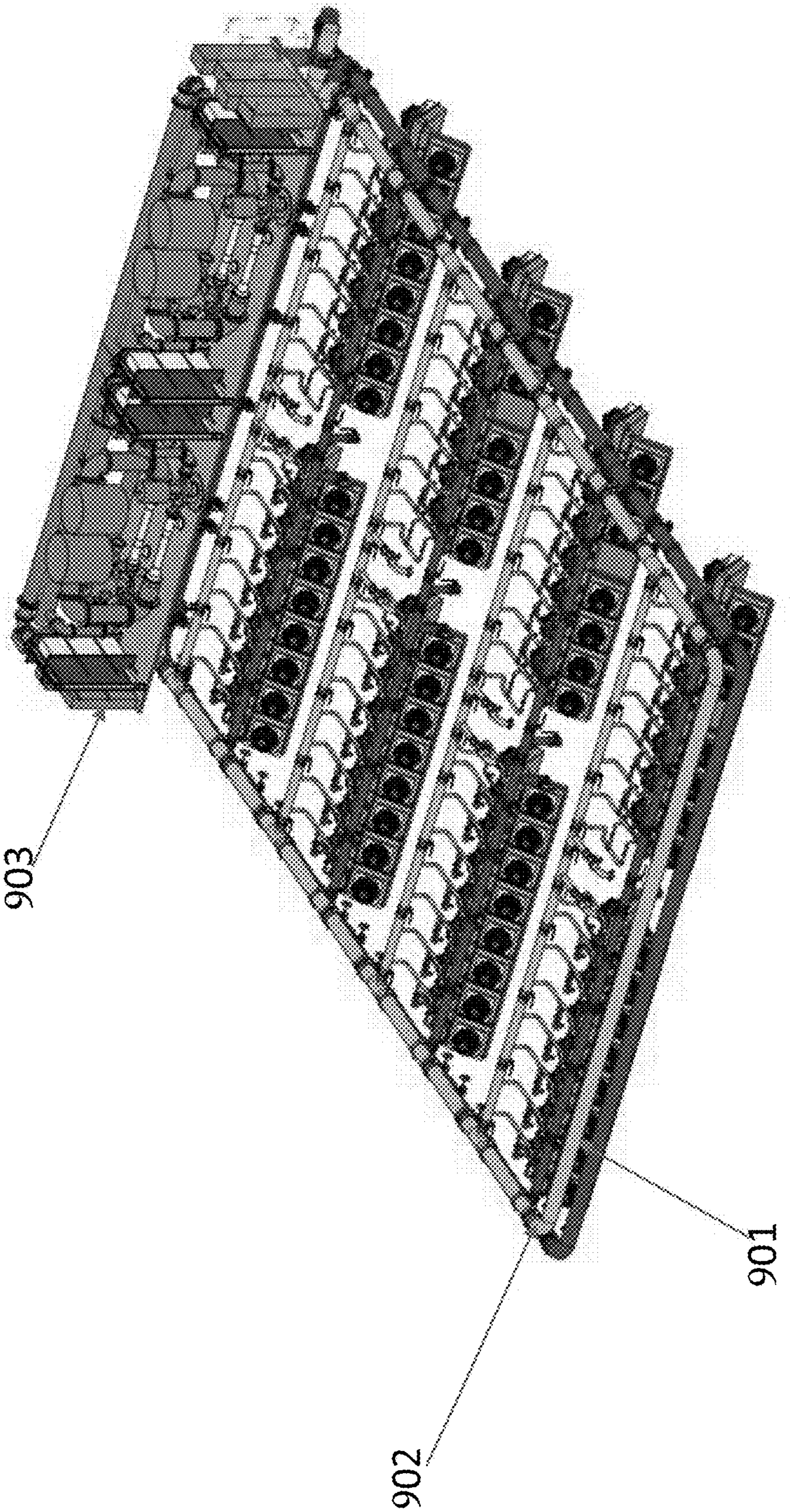
FIG. 9 illustrates the architecture of Coolant Distribution Piping comprised in the cooling equipment and operatively coupled to cooling modules mounted underneath the MIS steel truss.

FIG. 3 is a top view of the embodiment illustrated in FIG. 2 i.e., the MEP space. According to the illustrated embodiment, roof 301 mounted cooling equipment 305, electrical equipment 302 and modular infrastructure slab (MIS) modules 303 are shown. FIG. 4 illustrates a cross-sectional view of MEP, Structural Floor, Ceiling and Data Hall. Data Racks 403, electrical equipment 401 and cooling modules 402 are shown. FIG. 5A illustrates a primary electrical modular infrastructure slab (MIS) view according to an embodiment. FIG. 5B illustrates cross sectional end view of electrical modular infrastructure slab (MIS) according to an embodiment. The figures show electrical module and MIS module mounted on MIS steel truss 503 and coolant inflow/outflow pipes 501 and 502. FIG. 6A illustrates an aisle/cooling MIS cooling equipment. FIG. 6B illustrates a cross sectional end view of the aisle/cooling MIS cooling equipment. The figures show cold coolant pipes 601 and hot coolant return pipes 602 embedded inside MIS steel truss 603 and cooling modules 604 operatively connected to MIS cooling equipment. According to one embodiment, cooling modules 604 comprise variable frequency drive (VFD) fans to circulate hot air which rises in the hot aisle through the cooling unit for temperature control. FIG. 7A illustrates a cross sectional view of Coolant Distribution Unit (CDU) MIS comprised in the cooling equipment, according to an embodiment. FIG. 7B illustrates a cross sectional end view of Coolant Distribution Unit (CDU) MIS comprised in the cooling equipment according to an embodiment. The figures show cold coolant pipes 701 and hot coolant return pipes 702 embedded inside MIS steel truss 703 and coolant distribution unit (CDU) modules 704 operatively connected to MIS cooling modules (not shown). FIG. 8A illustrates a cross sectional view of accessory MIS according to an embodiment. FIG. 8B illustrates a cross sectional end view of reserve power systems module MIS according to an embodiment. Depicted in FIGS. 8A and 8B are cold coolant pipes 801 and hot coolant pipes 802, MIS streel truss 803 and electrical modular infrastructure slab (MIS) 804. FIG. 9 illustrates the architecture of Coolant Distribution Unit (CDU) MIS comprised in the cooling equipment and mounted on MIS steel truss, according to an embodiment. The figure shows cold coolant pipes 901, hot coolant return pipes 902, and coolant distribution unit (CDU) modules 903

Figure 10:
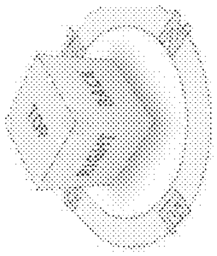
FIG. 10 illustrates a 3-Dimensional aspect of the invention according to one embodiment.
Figure 10:
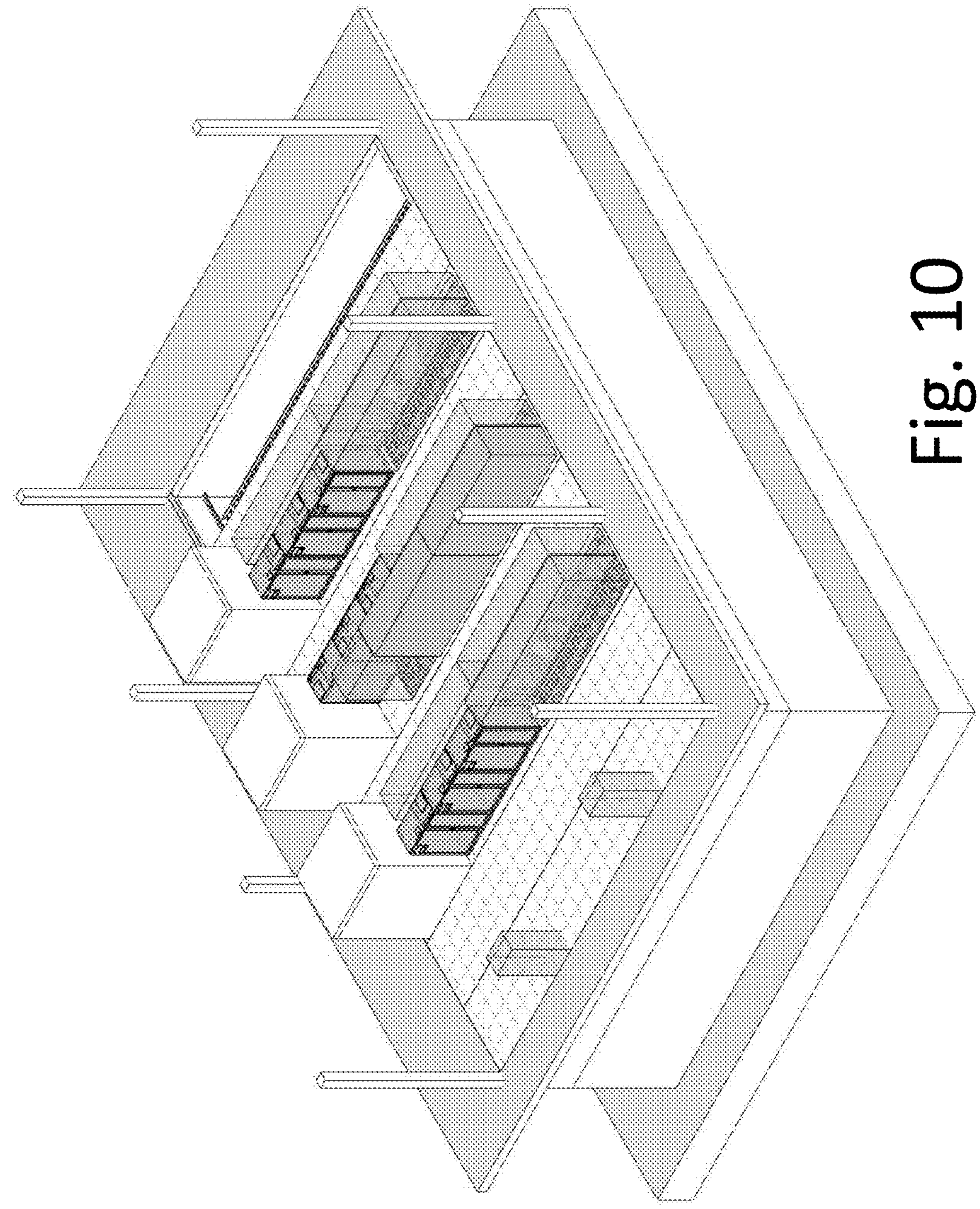

The industrialization of data center construction has enabled the industry to dramatically reduce build times and cost per megawatt. The Nautilus Modular Infrastructure Slabs (MIS) take the next step in the evolution of modularization by creating a combined MEP, Structural, and Data Hall Ceiling element that can be factory built, tested, shipped and placed onto a defined support structure to rapidly assemble and commission a land or vessel-based data center. FIG. 1 illustrates a 2-Dimensional aspect of the invention according to one embodiment. FIG. 10 illustrates a 3-Dimensional aspect of the invention according to an embodiment.

Embodiments disclosed enable reconfigurable modularity and skid design. According to some embodiments Rear Door Heat Exchangers can be replaced by modular rooftop heat exchangers in a modular data center environment. According to preferred embodiments Rear Door Heat Exchanger space saving alternatives include Open Loop or/and closed loop systems coupled to variable frequency drive fans to suck up heated air from hot aisle configurations and circulate cool air through the data center. As the data center is heated the air around it is sucked out from top and cool air is circulated from the bottom, making for highly efficient heat transfer.

Modular designs in disclosed embodiments enable greater flexibility, power consumption savings, and highly efficient cooling. Additionally, modular closed and open loop rooftop cooling structures enable highly elastic, expandable and contractable cooling systems.

Rear Door Heat Exchangers at the Data Center level may not need variable frequency drive fans owing to elastic modular cooling systems. Variable Frequency Drive Fans may only be needed if we have 50 KW or higher Ultra High Density (UHD) Data Centers.

Modularity entails modularity of rack mounted Data Center Server Modules, Electrical power supply Modules, and Cooling Modules.

Embodiments disclosed enable plug and play reconfigurability of Data Center, Electrical and Cooling Modules in a scalable, expandable, and contractable Lego like structure. For example, regular data centers need standard 600 mm sliding doors. If the data center is expanded to include ultra-high density server racks, provision is made for 800 mm sliding doors. Embodiments disclosed include unique space and resource saving designs wherein the server floor is on the first floors and all the modular infrastructure is on the second storey.

Embodiments disclosed enable creation of a set of standardized data center building blocks. Embodiments disclosed include superior designs adaptable to land and water-based platforms, and reduced overall data center build costs while maintaining flexibility of configuration. Embodiments disclosed enable maximized operational efficiency, and pre-fab factory built and tested critical infrastructure, minimizing on-site fit out and skilled trade work.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus, it will be understood by those skilled in the art of data center systems and methods, and more specifically automated modular infrastructure especially pertaining to data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed concurrently, or the blocks may sometimes be executed in the reverse order, depending upon the functionality involved.

The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof.

The present invention and some of its advantages have been described in detail for some embodiments. It should be understood that although the system and process is described with reference to modular infrastructure slabs and data center systems and methods, the system and method is highly reconfigurable, and may be used in other computing, industrial, commercial, and residential refrigeration, cooling, heating and HVAC systems. Portions of the embodiment may be used to support other types of heating, cooling, ventilation, and refrigeration systems in industrial, commercial, residential, transportation, and other systems. Modifications of the embodiments may be used in heat transfer systems, and to capture emitted heat from heat sources and convert the captured heat to electricity to serve as an auxiliary power source. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps

What is claimed is:

1. A data center facility comprising:

a data hall comprising:

one or more server modules, wherein each of the one or more server modules comprise one or more server racks; and interfaces for facilitating electrical power supply, data connectivity, and cooling media supply to the one or more server modules, wherein each of the one or more server modules is configured to receive the electrical power supply, the data connectivity, and the cooling media through the interfaces, wherein each of the one or more server modules is configured to be coupled to or decoupled from another one of the one or more server modules;

a plurality of reconfigurable utility modules, wherein each of the plurality of reconfigurable utility modules is configured to be coupled to or decoupled from another one of the plurality of reconfigurable utility modules, wherein each of the plurality of reconfigurable utility modules comprises electrical equipment comprising one or more members selected from the group consisting of cooling equipment, fire protective equipment, a backup power generator, and an uninterruptable power supply;

a truss platform separating the plurality of reconfigurable utility modules and the data hall such that each of the one or more server modules are disposed below the truss platform and each of the plurality of reconfigurable utility modules are disposed above the truss platform, wherein the truss platform is configured to be coupled to or decoupled from another truss platform to form an extended truss platform; and a cooling system embedded inside the truss platform below the plurality of reconfigurable utility modules and above the one or more server modules, wherein the cooling system is configured to fluidically couple the cooling equipment to the interface for facilitating cooling media supply to the one or more server racks, wherein the cooling system comprises pipes carrying hot and cold fluid;

wherein the cooling system is configured to implement a closed loop cooling system in the data center facility, wherein the closed loop cooling system is operatively coupled to an open loop modular cooling system.

2. The data center facility of claim 1, wherein the cooling equipment is operatively coupled to at least one of one or more server modules.

3. The data center facility of claim 1, wherein the backup power generator is attached to at least one of the server modules through the interfaces.

4. The data center facility of claim 1, wherein the one or more server modules and the electrical equipment are prefabricated away from a site at which the data center facility is located, wherein the one or more server modules comprise shipping containers in which the one or more server racks are installed.

5. The data center facility of claim 1, wherein the electrical equipment is chosen to allow the data center facility to satisfy a specified reliability level.

6. The data center facility of claim 1, wherein each of the plurality of reconfigurable utility modules, the electrical equipment, or both comprise a separate shipping container.

7. The data center facility of claim 1, wherein each backup power generator is attached to the each of the plurality of reconfigurable utility modules through a utility spine.

8. The data center facility of claim 1, wherein the closed loop cooling system comprises a water-based cooling system or an environmentally friendly coolant-based cooling system.

9. The data center facility of claim 1, wherein the plurality of reconfigurable utility modules and the electrical equipment are each integrated within a support structure of the data center facility.

10. The data center facility of claim 9, wherein the support structure comprises a structural framing of the data center facility.

11. The data center facility of claim 1, wherein the data center facility comprises at least two levels.

* * * * *